US006708306B2

(12) United States Patent
Bartenstein et al.

(10) Patent No.: US 6,708,306 B2
(45) Date of Patent: Mar. 16, 2004

(54) METHOD FOR DIAGNOSING FAILURES USING INVARIANT ANALYSIS

(75) Inventors: Thomas W. Bartenstein, Owego, NY (US); Joseph M. Swenton, Owego, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 335 days.

(21) Appl. No.: 09/739,048

(22) Filed: Dec. 18, 2000

(65) Prior Publication Data

US 2002/0120891 A1 Aug. 29, 2002

(51) Int. Cl.$^7$ ........................... G01R 31/28; G06F 11/00
(52) U.S. Cl. ............................. 714/741; 703/15; 716/4
(58) Field of Search .................... 714/724, 741, 714/738, 37; 716/18, 1–4; 703/13, 15, 23; 717/130–131, 124, 135

(56) References Cited

U.S. PATENT DOCUMENTS

| | | | | |
|---|---|---|---|---|
| 5,390,193 A | * | 2/1995 | Millman et al. | 714/741 |
| 5,410,548 A | * | 4/1995 | Millman | 714/741 |
| 5,414,715 A | * | 5/1995 | Hamblin et al. | 714/724 |
| 5,426,770 A | * | 6/1995 | Nuber | 703/15 |
| 5,548,715 A | * | 8/1996 | Maloney et al. | 714/28 |
| 5,566,187 A | * | 10/1996 | Abramovici et al. | 714/724 |
| 5,801,693 A | | 9/1998 | Bailey | 345/339 |
| 5,996,101 A | * | 11/1999 | Masumoto | 714/738 |
| 6,163,763 A | * | 12/2000 | Cox et al. | 703/17 |
| 6,175,946 B1 | * | 1/2001 | Ly et al. | 716/4 |
| 6,298,472 B1 | * | 10/2001 | Phillips et al. | 716/18 |
| 6,353,906 B1 | * | 3/2002 | Smith et al. | 714/741 |
| 6,453,437 B1 | * | 9/2002 | Kapur et al. | 714/741 |

OTHER PUBLICATIONS

Funatsu et al., "Test generation systems in Japan", DAC, 1975.*
Wunderlich, "PROTEST: a tool for probabilistic testability analysis", DAC, 1985.*
Abramovici et al., "Fault Diagnosis based on effect–cause analysis: An introduction", DAC, 1980.*
Wu et al., "A probablistic testability measure for delay faults", DAC, 1991.*
McCluskey, "Verification testing", DAC, 1982.*
Abramovici et al., "Critical path tracing—an alternative to fault simulation", DAC, 1983.*
Patel, "effectiveness of heuristic measures for automatic test pattern generation", DAC, 1986.*
Kirkland, "A topological search algorithm for ATPG", DAC, 1987.*
Switzer, "Using Embedded Checkers to Solve Verification Challenges", DesignCon 2000, Feb. 3, 2000.*
Switzer, "Functional Verification Using Embedded Checkers", HDLcon 2000, 2000.*

* cited by examiner

Primary Examiner—Guy J. Lamarre
(74) Attorney, Agent, or Firm—Orrick, Herrington & Sutcliffe LLP

(57) ABSTRACT

A method for diagnosing failures within an integrated circuit where known diagnostic fault simulators are unable to detect failure mechanisms which do not conform to known failure models. Basic boolean equations are used to describe the internal nodes forming the logic. These equations are then evaluated by way of a good machine simulation to determine which of the equations are (most) true for failing test patterns and (most) false for passing patterns. At the end of the good machine simulation a score is calculated to determine the number of times (or percentage) for which the equation is true for failing patterns and false for passing patterns. The method is particularly effective for finding shorted nets pairs in which the failure mechanism does not fall within known models. The method described is instrumental in greatly reducing the time required for manual analysis of failure mechanisms not conforming to known models.

13 Claims, 3 Drawing Sheets

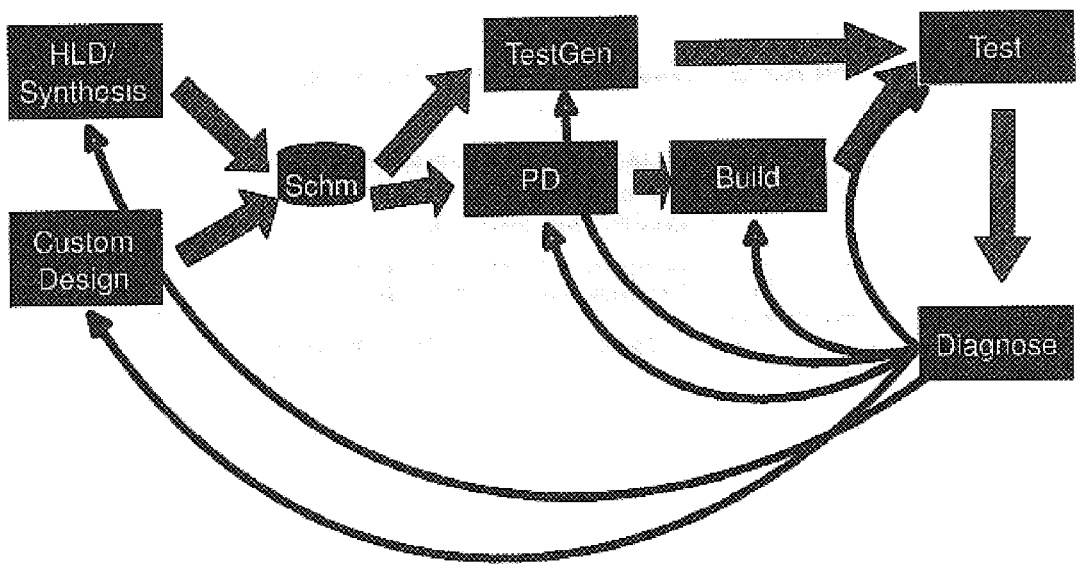
Fig. 1 - PRIOR ART
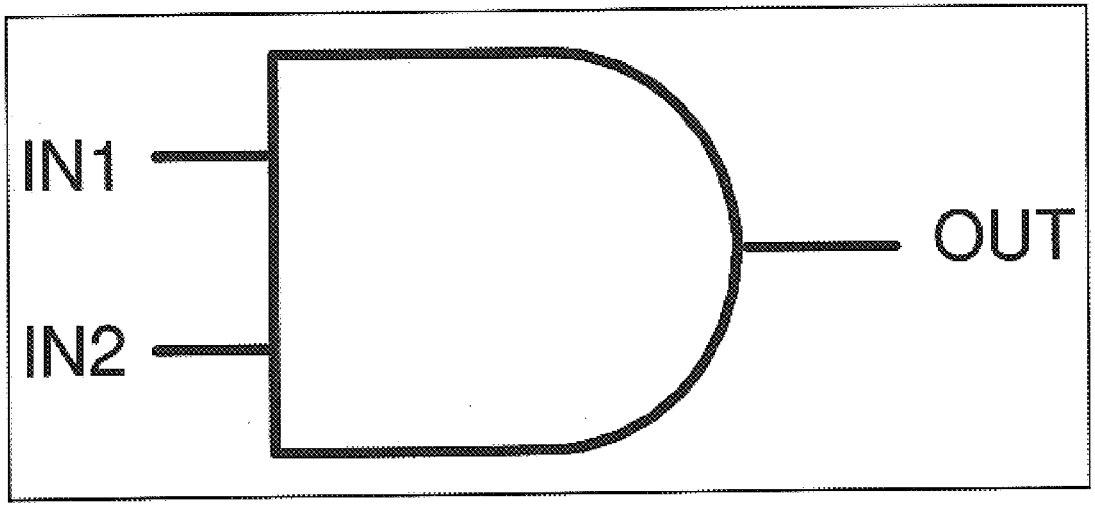
Figure 2 - PRIOR ART

Figure 3: PRIOR ART
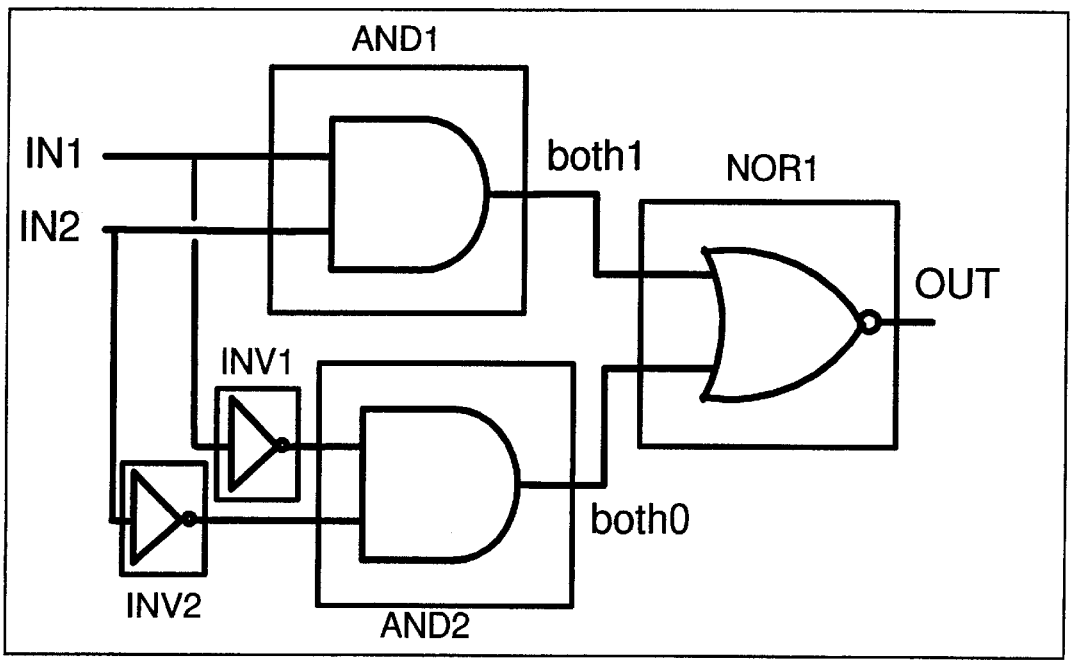
Figure 4: PRIOR ART
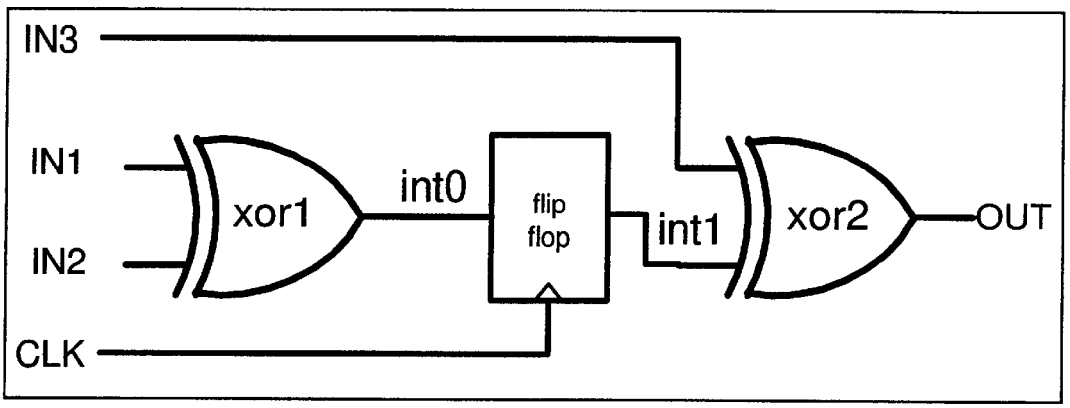

METHOD FOR DIAGNOSING FAILURES USING INVARIANT ANALYSIS

FIELD OF THE INVENTION

The invention relates generally to electronic design automation, and more particularly to testing and diagnosing failures within an integrated circuit (IC) to determine the cause of the IC failing to perform as expected.

BACKGROUND AND PRIOR ART

The process of determining the root cause of a failing integrated circuit has been vital to the timely and cost effective production of integrated circuits for many years. If the cause of a failure can be determined, the error which causes the failure can often be corrected or prevented from reoccurring. Information about the root cause of the problem can lead to improvements in the design process, the design itself, the manufacturing process, and the test process. It has long been recognized that the capability to determine the root cause of a failure is vital to achieve and maintain high yields in manufacturing, and the manufacturing yields directly affect the cost of manufacturing integrated circuits. The ability to quickly improve yields also allows an IC to become marketable quickly, which directly affects the profitability of the IC.

The entire process describing the prior art methodology for designing and testing ICs including engineering feedback loops is illustrated in FIG. 1. The process starts with either a high-level design using a high level design language (HDL), followed by synthesis or, alternatively, with a custom design. The results is a schematic (Schm) of the IC. The schematic is used both to create both the physical design (PD), a physical implementation of the schematic, and acting as input to test generation (TestGen) to generate the test patterns to ensure the circuit is performing as designed. The physical design then proceeds to manufacturing, where the IC is built (Build). The IC is then tested (Test) using the test patterns generated by the test generation process. If the test fails, the next step is to determine the root cause of the failure (Diagnose). If the root cause can be determined, information about the root cause can be used to modify the design processes, the test generation processes, or the manufacturing processes in order to prevent the defect from reoccurring.

Many tools have been used historically to determine the cause of test failures. The most important tool to date has been the use of fault simulation to identify a fault whose behavior matches or closely matches the faulty behavior measured at a tester. This process is often referred to as "fault isolation". The process of fault isolation depends on the capability to model the behavior of a defect as a fault. However, in order to keep the fault simulation process tractable, the kinds of faults typically modeled for fault isolation tend to be simplified models of defect behavior. The most often used example of fault modeling is the "single stuck-at" fault model. In this model, a faulty behavior is modeled as if an internal pin of the integrated circuit is stuck at a single specific logic value (either 0 or 1) for the entire duration of the test. Furthermore, it is assumed that only a single specified internal pin exhibits the faulty behavior, and that the rest of the integrated circuit behaves exactly as it is modeled. The single stuck fault correctly models such defects as a wire that is incorrectly connected to either a voltage source, or to ground. For simple integrated circuit (IC) technologies, the single stuck fault model along with the process of fault isolation has proven practical to determine to cause of integrated circuit failures for many years. However, as technology becomes more complex, as the density of the wiring gets higher, as the speeds at which the circuits are expected to behave gets faster and faster, and as the voltage used to drive the circuits get lower and lower, many new secondary failure mechanisms are now more important to understand and prevent. In these cases, the process of fault isolation using a simple single stuck at fault model is not sufficient to identify the root cause of most of these more complicated failure mechanisms. More details regarding fault simulation and fault isolation may be found in several references, such as a textbook by P. K. Lala "Fault Tolerant & Fault testable Hardware Design" published by Prentice Hall Intl., Inc. 1985.

The intent of the present invention is to provide more information about the environment that exists in the IC when it fails. An IC can be modeled as a combination of logic gates and memory elements that are connected by electrical nets. The logic gates consist of one or more inputs connected to nets, and at least one output whose value depends of the value of the inputs. For instance, a two input AND gate has an output value of 1 only when both inputs are 1, and a value of 0 otherwise. A memory or sequential element is a gate which also has inputs and an output, although the memory element can capture a value and retain that value over time. For instance, a level sensitive latch captures the value on a data input pin when the clock input is at 1, and retains that value when the clock input is at 0. A test of the circuit consists of stimulating the inputs of the circuit and forcing values to propagate through the gates and memory elements to the point where the results of the simulation can be measured at the output pins of the circuit. At a tester, the measured results are compared against expected results. If the measured results are different than the failing results, the circuit fails the test. In the course of a single test, each net may take on many different logic values. The logic values on all internal nets at any given time can be considered a "circuit state". Thus, an IC may go through several circuit states within a single test. The single stuck fault model simulates a defect which affects a single net in every circuit state. However, failures which do not behave like a single stuck fault often do not exhibit such static behavior. Instead, these defects only manifest themselves when specific conditions occur in the circuit state.

One example of a failure mechanism which does not behave like a stuck fault is a "shorted net" fault. Often, when wires in the IC are close together, a piece of foreign material may connect two wires together. When such a short occurs, there are several ways in which incorrect results may occur. For this example, assume that one of the two shorted nets is electrically 'stronger' than the other. In this case, the value on the weak net will be overridden by the value on the strong net. The result is that the weaker net will behave like a single stuck-at-0 fault when the stronger net is at 0, but the weaker net will behave like a stuck-at-1 fault when the stronger net is at 1. Furthermore, the failure cannot produce an incorrect measure value unless the strong net is at a value that is different from the value at which the weaker net is supposed to be. Such a failure mechanism cannot be modeled with a single stuck fault model. In this case, the circuit will fail only when the strong net is opposite from the weak net.

OBJECTS OF THE INVENTION

Accordingly, it is a primary object of the invention to diagnose failures occurring within an integrated circuit (IC) by determining the root cause of the IC failing to perform as expected.

It is a further object to determine the necessary conditions in the circuit state under which a failure occurs.

It is another object to determine that every time a failure in the form of a short occurs, the strong net is at a value opposite to the value expected in the weak net.

It is yet another object to determine that every time the circuit does not fail, the weak net and the strong net are expected to be at the same value.

It is still another object to identify a dominant net within the logic given a candidate dominated net (available from analysis of traditional stuck fault diagnostics.

It is a more particular object to identify within the logic the other net that participates in the short given one net of a shorted net pair that behaves like an AND or OR.

It is yet another object to quickly identify a small set of stuck fault failure candidates in order to improve the performance of traditional stuck fault diagnostics.

It is a further object to identify portions of the logic which participate in non-stuck fault failures. (For instance, by identifying a clock chopper that is enabled only when a failure occurs and is not enabled otherwise, or when the clock chopper is disturbed by noise generated by, e.g., an array elsewhere in the circuit, and behaves incorrectly.

It is yet a further object to quickly analyzing contiguous nets with a localized area and determining from this analysis to determine if the two nets are shorted together.

SUMMARY OF THE INVENTION

These and other objects of the invention are addressed by providing a method for finding the root cause of failures occurring in IC using Invariant Analysis which allows a user to formulate queries by specifying basic Boolean equations in terms of internal nets or pins in the circuit. These equations are then evaluated through good machine simulation to determine which equations are (most) true for failing test patterns and (most) false for passing test patterns. The result is a tool which can greatly reduce the time required for manual analysis of a failure mechanism which does not behave like a modeled fault.

In one aspect of the invention there is provided a method for diagnosing failures within logic being tested, the logic being represented by a plurality of nodes interconnected by way of nets, the relationship between the logic and the failures being provided by boolean equations (BEs), the method including the steps of: a) parsing the BEs; b) defining a plurality of categories indicative of matches between the BEs to failures within the logic; c) performing a simulation of the logic by way of test patterns, periodically invoking a monitor to determine the occurrence of a match between the BEs and the failures occurring in the logic; d) incrementing at periodic intervals a count in the category which describes the relationship between the equations, the failures, and simulated logic values, and accumulating the respective counts in each of the categories for each successive BE; and e) calculating for each of the categories a final score based on the respective incremental counts, wherein the final score is indicative of a correlation existing between conditions specified by the BEs and the failures within the logic.

BRIEF DESCRIPTION OF THE DRAWINGS

The accompanying drawings which are incorporated and which form part of the specification illustrate presently a preferred embodiment of the invention and, together with the general description given above and the detailed description of the preferred embodiment given below, serve to explain the principles of the invention.

FIG. 1 illustrates a prior art process for designing and manufacturing an IC.

FIG. 2 is a schematic representation of a conventional two-input AND gate circuit.

FIG. 3 is a schematic of a prior art combinational circuit which performs an exclusive OR function.

FIG. 4 is a schematic diagram of a conventional sequential circuit that serves to illustrate details of the Invariant Analysis as a tool for analysing failures in an IC.

DETAILED DESCRIPTION OF THE PREFERRED EMBODIMENTS

Figure 5:
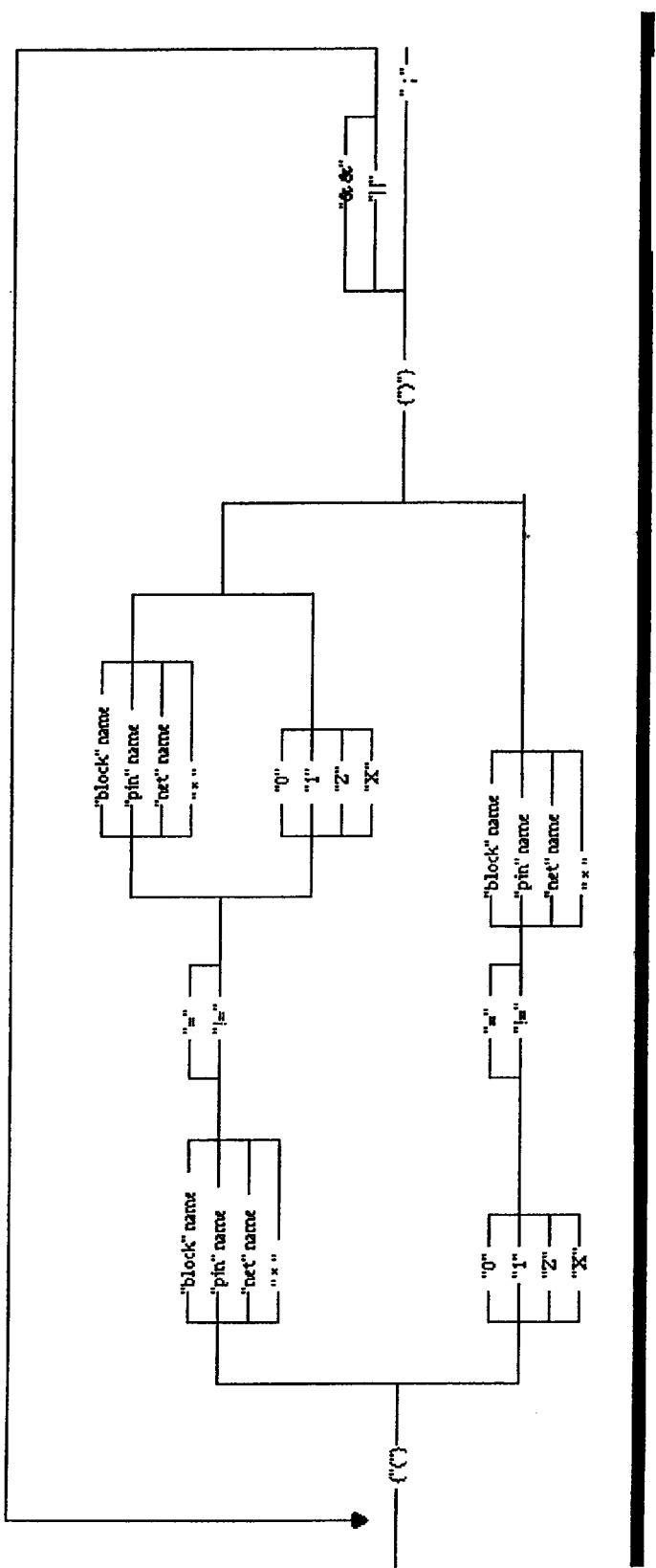
FIG. 5 describes the syntax of boolean equations applicable to the Invariant Analysis of the present invention.

The inventive method describes an IC represented by a set of pins and nets. The software has access to a schematic model of the integrated circuit, the test patterns used to test the circuit, and information about which test patterns failed at the tester when the integrated circuit was tested. The user of the software provides queries about the failing circuit in the form of boolean equations that describe specific conditions in the circuit. The software simulates the test patterns using the schematic model of the circuit to produce expected results as the outputs of the circuit, as well as information concerning the internal circuit states of the schematic model. The simulation is compared with the boolean equations to determine the "truth value" of the equations. The equations are true or false in a specific circuit state. Since the information about which test patterns fail s is also available to the software, it can evaluate for each circuit state of interest whether an input equation is true for a passing pattern, false for a passing pattern, true for a failing pattern, or false for a failing pattern. For any given circuit state, each equation fall into one of the aforementioned four categories. Furthermore, the software accumulates statistics for each equation in such a way that at the end of the simulation of the test patterns, the count of how many times each equation fits into each category is collected. At the end of the simulation, these counts for each equation can be plugged into a mathematical formula which assigns a score to each boolean equation. The score represents how often the equation was true for the passing patterns and false for the failing patterns. As such, the score represents the correlation between the boolean equations, and the defect which caused the chip to fail. Equations which have a high score are called "invariant" for the failing patterns, and contribute much information about the failing mechanism.

Invariant Analysis Algorithm

The algorithm performing the above stated function consists of three phases:

The first phase is the initialization phase. Therein, the user's queries in the form of boolean equations are parsed and kept in a parse tree format to facilitate their evaluation. The initialization phase also reserves four integers for each equation corresponding to the four categories, i.e., True for Passing Patterns (TP), False for Passing Patterns (FP), True for Failing Patterns (TF) and False for Failing Patterns (FF). Each of these integers are initialized to 0.

The second phase of the algorithm is the simulation monitor phase. During this phase, a standard circuit simulation is performed with a set of test patterns. At strategic points during the simulation of these patterns, the invariant analysis monitor takes over control. When the monitor is in control, it has access to the current values on all the nets in the circuit under simulation. The monitor uses these values to evaluate each equation to determine whether it is true or false at that given time. The monitor also knows whether the current test pattern being simulated passes or fails at the tester. Using this information, the monitor can classify each equation into one of the four categories. The integer which represents the valid category is incremented. This is repeated for each test pattern. When this phase is complete, the invariant analysis tool has accumulated statistics which define how many times each equation fell into each category.

The third and final phase of invariant analysis is a reporting phase. Therein, the statistics that were gathered for each equation are mathematically combined to determine a score for each equation. Then a report is generated, which represents the results of the tool. The report contains one line for each boolean equation. Each line consists of the final score for the equation, the statistics for the equation (TP, FP, TF, and FF counts), and the definition of the equation. The report is sorted in such a way that the equation which has the highest score appears at the bottom of the report.

Simple Combinatorial Example

The method of the present invention can be demonstrated by an example using a conventional AND circuit schematically shown in FIG. 2. Therein, there is depicted a schematic representation of a two-input AND gate circuit having as input pins, IN1 and IN2, each connected to a net also called IN1 and IN2. Both nets connect the input pins to the inputs of the AND gate. The output of the AND gate is connected to a net referred to OUT, which, in turn is connected to an output pin of the circuit referred to OUT.

A simple set of test patterns for this circuit is contained in the following table.

| Pattern | IN1 Value | IN2 Value | OUT Value |
| --- | --- | --- | --- |
| Pattern 1 | 0 | 0 | 0 |
| Pattern 2 | 0 | 1 | 0 |
| Pattern 3 | 1 | 0 | 0 |
| Pattern 4 | 1 | 1 | 1 |

Assuming that the patterns were applied at the tester, and the tester reported that the OUT value measured at the tester matched the expected values in the above table except pattern 3 produced a value of 1 at the tester instead of the expected 0.

By way of example, equation "Pin IN2=0; "is used. During the initialization phase, the tool creates four integers, TP, FP, TF, FF, for this equation, all initialized to 0. The simulation phase starts with pattern 1. Notice that pattern 1 passed at the tester, and that pin IN2 is at zero in pattern 1, so, for pattern 1, the equation is true for a passing pattern. Thus, the TP value is incremented to 1. Pattern 2 was also a passing pattern, but in pattern 2, IN2 is at 1, and not at 0. For pattern 2, the equation is false for a passing pattern, so FP is incremented to 1. Pattern 3 is the failing pattern, and the value of IN2 is again set to 0, which causes TF to switch to 1. Pattern 4 is another passing pattern where IN2 is at 1, so that FP is now incremented a second time, and its value becomes 2. At the end of the simulation phase, the statistics gathered can be represented by the following table.

| Equation | TP | FP | TF | FF |
| --- | --- | --- | --- | --- |
| Pin IN2 = 0; | 1 | 2 | 1 | 0 |

The third phase of invariant analysis consists of creating a score from the statistics, and creating a report. The score needs to reflect how well the equation is associated with the failures. To accomplish this goal, the score consists of two components. The first component is a percentage of the passing patterns when the equation was false. Notice that for any equation, the total number of passing patterns consists of the sum of TP and FP, in this case, 3. The percentage of passing patterns which were false in this case is $\frac{2}{3}$, or 66.6%. The second component of the score consists of the percentage of failing patterns which were true. Again, the total number of failing patterns can be calculated by adding TF+FF, in the present case, 1. The percentage of failing patterns which were true in this case is $\frac{1}{1}$, or 100%. A simple method to combine these components is to average the percentages. In this case, (100+66.6)/2 yields a score of 83.3. This score indicates that pin IN2 at zero has a fairly high correlation with the circuit failing at the tester, but not a perfect correlation. The only way to get a perfect correlation is when the equation is true for every failing pattern (as it is in this case), and the equation is false for every passing pattern (which it is not in this case.)

A typical use of the invariant analysis tool is to determine if there is any net at some value which is associated with a failure. In the example of FIG. 2, that goal can be accomplished by using the following boolean equations.

Pin IN1=0;
Pin IN1=1;
Pin IN2=0;
Pin IN2=1;
Pin OUT=0;
Pin OUT=1.

Performing the exact same analysis as with the simple equation above, the following results can be obtained.

| Score | TP | FP | TF | FF | Equation |
| --- | --- | --- | --- | --- | --- |
| 16.6 | 2 | 1 | 0 | 1 | Pin IN1 = 0 |
| 83.3 | 1 | 2 | 1 | 0 | Pin IN1 = 1 |
| 83.3 | 1 | 2 | 1 | 0 | Pin IN2 = 0 |
| 16.6 | 2 | 1 | 0 | 1 | Pin IN2 = 1 |
| 66.6 | 2 | 1 | 1 | 0 | Pin OUT = 0 |
| 33.3 | 1 | 2 | 0 | 1 | Pin OUT = 1 |

Notice that there are two equations, both with a relatively high score, namely, Pin IN1=1 and Pin IN2=0. This result may lead to a supposition that a single pin at a value is not enough to predict the failing mechanism.

A typical failing mechanism is a shorted net, where the value of one net forces the other net to the same value, called a dominant net short. It is often possible to identify the dominated net using standard diagnostic tools, but it is often very difficult to identify the dominating net. Note that for a dominant net short to cause a mismatch, the dominated net must be at a different value from the dominating net. If the two nets are at the same value, no incorrect results will occur.

Supposing that standard diagnostic tools had identified net IN2 as a dominated net. In this case, the following equations could be used to identify the dominating net by comparing net IN2 with every other net in the circuit.

Net IN1 !=Net IN2;
Net OUT !=Net IN2;

The result of these equations with invariant analysis is as follows.

| Score | TP | FP | TF | FF | Equation |
|---|---|---|---|---|---|
| 83.3 | 1 | 2 | 1 | 0 | Net IN1 != Net IN2 |
| 33.3 | 1 | 2 | 0 | 1 | Net OUT != Net IN2 |

Notice that net IN1 is a much better candidate than net OUT as a dominator of net IN2, although there is still a TP value of 1 which prevents a perfect 100 score. This condition illustrates one of the problems with invariant analysis, namely that a defect may occur, but the results of that defect may not be measured. In this case, pattern 2 sets pin IN1 to zero and IN2 to one. If net IN1 dominates net IN2, then such a failure will cause net IN2 to take a value of 1 instead of 0. However, the results of the difference in net IN2 cannot be observed because the AND gate is controlled by the zero from net IN1. Therefore, the results of net IN1 dominating net IN2 cannot be observed.

In general, it is possible to assume that if a failure was measured at the tester, the defect mechanism was both enabled and observed. If a failure was not observed at the tester, then the defect mechanism may have been enabled, but was not observed. For this reason, it is more effective to use an alternate scoring mechanism which weighs the second component of the score, the percentage of failing patterns for which the equation is true, much higher than the first component, the percentage of passing patterns for which the equation was false. For instance, it is possible to arbitrarily weigh the second component as nine times more important as the first component. This weighting can be represented in a scoring formula as follows.

$$\text{Score} = 10 \times \left[ \frac{9TF}{(TF + FF)} + \frac{FP}{(TP + FP)} \right]$$

Using this alternate scoring formula, the scores from the equations described so far for the example in FIG. 2 will result in the following:

| Score | TP | FP | TF | FF | Equation |
|---|---|---|---|---|---|
| 3.3 | 2 | 1 | 0 | 1 | Pin IN1 = 0 |
| 96.6 | 1 | 2 | 1 | 0 | Pin IN1 = 1 |
| 96.6 | 1 | 2 | 1 | 0 | Pin IN2 = 0 |
| 3.3 | 2 | 1 | 0 | 1 | Pin IN2 = 1 |
| 93.3 | 2 | 1 | 1 | 0 | Pin OUT = 0 |
| 6.6 | 1 | 2 | 0 | 1 | Pin OUT = 1 |
| 96.6 | 1 | 2 | 1 | 0 | Net IN1 != Net IN2 |
| 6.6 | 1 | 2 | 0 | 1 | Net OUT != Net IN2 |

Finally, these results are sorted, with the highest score appearing last, so the final report will look like the following:

| Score | TP | FP | TF | FF | Equation |
|---|---|---|---|---|---|
| 3.3 | 2 | 1 | 0 | 1 | Pin IN1 = 0 |
| 3.3 | 2 | 1 | 0 | 1 | Pin IN2 = 1 |
| 6.6 | 1 | 2 | 0 | 1 | Pin OUT = 1 |
| 6.6 | 1 | 2 | 0 | 1 | Net OUT != Net IN2 |
| 93.3 | 2 | 1 | 1 | 0 | Pin OUT = 0 |
| 96.6 | 1 | 2 | 1 | 0 | Pin IN1 = 1 |
| 96.6 | 1 | 2 | 1 | 0 | Pin IN2 = 0 |
| 96.6 | 1 | 2 | 1 | 0 | Net IN1 != Net IN2 |

This simplistic example illustrates the mechanism used to calculate the invariant analysis results, but the circuit is too simple to yield results that are very helpful. In practice, thousands of patterns are simulated, and the results of invariant are much more interesting. The example in FIG. 3 demonstrates the same basic theory, but in a slightly more complicated circuit where the results are a little more interesting. This is explained hereinafter.

Invariant Analysis Example on a Hierarchical Circuit

Referring now to FIG. 3, there is shown an exclusive-or circuit. The top level of hierarchy contains two input pins, IN1 and IN2, and one output pin, OUT. This level of hierarchy also contains instances of four lower level cells. The first instance is called AND1 and is an instance of a cell which contains a single AND gate as in FIG. 2. Another instance of an AND gate is called AND2. There are also two instances of inverters called INV1 and INV2, and an instance of a NOR gate called NOR1. A net called IN1 (not labeled in the figure) connects input pin IN1 to an input pin of instance AND1 and also to an input pin of INV1. A second net called IN2 (also unlabelled) connects input pin IN2 to the second input of AND1 as well as the input of INV2. The output of AND1 is connected to a net called "both1", which is also connected to an input of NOR1. There are two nets (both unlabelled) which connect the outputs of INV1 and INV2 to the inputs of AND2. The output of AND2 is connected to a net called "both0", which connects to the other input of NOR1. The output of NOR1 is connected to a net called "OUT" (also unlabelled), which connects to the output pin called OUT. Each lower level cell also contains input and output pins and nets. For instance, the instance AND1 is an instance of an AND cell as described in FIG. 2. It has two input pins, IN1 and IN2, an output pin called OUT, and three nets with the same names which connect the pins to the AND gate itself. The test patterns applicable to this circuit may look like the following.

| Pattern | IN1 Value | IN2 Value | OUT Value |
|---|---|---|---|
| Pattern 1 | 0 | 0 | 0 |
| Pattern 2 | 0 | 1 | 1 |
| Pattern 3 | 1 | 0 | 1 |
| Pattern 4 | 1 | 1 | 0 |

Since the circuit is a hierarchical circuit, a hierarchical notation is used. A pin or net at the top level of the hierarchy is named with a simple name, but a pin inside one of the lower level cells must use a special hierarchical name. For these purposes, the hierarchical name will consist of a list of instance names separated by periods, followed by a period, followed by the simple name of the pin. Thus, pin IN1 connects to net IN1, which in turn, connects to pin AND1.IN1 as well as pin INV1.IN1. Pin AND1.IN is connected to net AND1.IN1, which is connected to the first AND gate.

Suppose in this case, the results from the tester indicate that pattern 2 failed by producing a 0 instead of a 1. Notice that even in this five gate circuit, there are seven nets, and it becomes more difficult to enumerate the boolean equations. To resolve this problem, an asterisk (*) may be used as a shorthand method for describing many equations. An asterisk represents "all the nets". Thus, the two equations,

*=0;
*=1;

can be used as a shorthand for the following list of equations:

Pin IN1=0;
Pin IN2=0;
Pin INV1.OUT=0;
Pin INV2.OUT=0;
Pin AND1.OUT=0;
Pin AND2.OUT=0;
Pin OUT=0;
Pin IN1=1;
Pin IN2=1;
Pin INV1.OUT=1;
Pin INV2.OUT=1;
Pin AND1.OUT=1;
Pin AND2.OUT=1;
Pin OUT=1.

The results of invariant analysis for these equations are as follows.

| Score | TP | FP | TF | FF | Equation |
|---|---|---|---|---|---|
| 3 | 2 | 1 | 0 | 1 | Pin IN2 = 0; |
| 3 | 2 | 1 | 0 | 1 | Pin OUT = 0; |
| 3 | 2 | 1 | 0 | 1 | Pin INV1.OUT = 0; |
| 3 | 2 | 1 | 0 | 1 | Pin NOR1.OUT = 0; |
| 3 | 2 | 1 | 0 | 1 | Pin IN1 = 1; |
| 3 | 2 | 1 | 0 | 1 | Pin INV2.OUT = 1; |
| 6 | 1 | 2 | 0 | 1 | Pin AND2.OUT = 1; |
| 6 | 1 | 2 | 0 | 1 | Pin AND1.OUT = 1; |
| 93 | 2 | 1 | 1 | 0 | Pin AND2.OUT = 0; |
| 93 | 2 | 1 | 1 | 0 | Pin AND1.OUT = 0; |
| 96 | 1 | 2 | 1 | 0 | Pin IN1 = 0; |
| 96 | 1 | 2 | 1 | 0 | Pin INV2.OUT = 0; |
| 96 | 1 | 2 | 1 | 0 | Pin IN2 = 1; |
| 96 | 1 | 2 | 1 | 0 | Pin OUT = 1; |
| 96 | 1 | 2 | 1 | 0 | Pin INV1.OUT = 1; |
| 96 | 1 | 2 | 1 | 0 | Pin NOR1.OUT = 1; |

Again, these results indicate that there are some suspect pins, but nothing gets a perfect score. As before, it is possible to postulate a dominant net short, where net IN2 is the dominated net. It is possible to check for dominating nets by adding the shorthand equation,

*!=Pin IN2;

This expands into six more equations, and the results follow.

| Score | TP | FP | TF | FF | Equation |
|---|---|---|---|---|---|
| 3 | 2 | 1 | 0 | 1 | Pin IN2 = 0; |
| 3 | 2 | 1 | 0 | 1 | Pin OUT = 0; |
| 3 | 2 | 1 | 0 | 1 | Pin INV1.OUT = 0; |
| 3 | 2 | 1 | 0 | 1 | Pin NOR1.OUT = 0; |
| 3 | 2 | 1 | 0 | 1 | Pin IN1 = 1; |
| 3 | 2 | 1 | 0 | 1 | Pin INV2.OUT = 1; |
| 3 | 2 | 1 | 0 | 1 | Pin IN2 != pin OUT; |
| 3 | 2 | 1 | 0 | 1 | Pin IN2 != pin INV1.OUT; |
| 3 | 2 | 1 | 0 | 1 | Pin IN2 != pin NOR1.OUT; |
| 6 | 1 | 2 | 0 | 1 | Pin AND2.OUT = 1; |
| 6 | 1 | 2 | 0 | 1 | Pin AND1.OUT = 1; |
| 10 | 0 | 3 | 0 | 1 | Pin IN2 != pin IN2; |

| Score | TP | FP | TF | FF | Equation |
|---|---|---|---|---|---|
| 90 | 3 | 0 | 1 | 0 | Pin IN2 != pin INV2.OUT; |
| 93 | 2 | 1 | 1 | 0 | Pin AND2.OUT = 0; |
| 93 | 2 | 1 | 1 | 0 | Pin AND1.OUT = 0; |
| 93 | 2 | 1 | 1 | 0 | Pin IN2 != pin AND2.OUT; |
| 96 | 1 | 2 | 1 | 0 | Pin IN1 = 0; |
| 96 | 1 | 2 | 1 | 0 | Pin INV2.OUT = 0; |
| 96 | 1 | 2 | 1 | 0 | Pin IN2 = 1; |
| 96 | 1 | 2 | 1 | 0 | Pin OUT = 1; |
| 96 | 1 | 2 | 1 | 0 | Pin INV1.OUT = 1; |
| 96 | 1 | 2 | 1 | 0 | Pin NOR1.OUT = 1; |
| 96 | 1 | 2 | 1 | 0 | Pin IN2 != pin IN1; |
| 100 | 0 | 3 | 1 | 0 | Pin IN2 != pin AND1.OUT; |

Notice that the result is that one equation achieved a perfect score of 100. The defect occurs only when pin IN2 takes an opposite value from pin AND1.OUT, and a defect always will always occur in this case. Such results are strong evidence that pin IN2 is dominated by the net connected to pin AND1.OUT.

Invariant Analysis on a Sequential Circuit

The circuit represented in FIG. 4 illustrates the use of the invariant analysis tool on a circuit which has memory elements. This circuit has three signal inputs, IN1, IN2, and IN3, and a clock input CLK. Inputs IN1 and IN2 feed an XOR labeled "xor1". The output of xor1 is the data input to a flip-flop (labeled "flip flop"). The flip-flop is a memory element whose initial value is unknown. When the clock input to the flip-flop is pulsed, the value of the data pin of the flip-flop becomes the output value. That value continues to be the output of the flip-flop, even if the data input changes until the next time the clock is pulsed. In this example, the output of the flip-flop feeds one input of a second XOR gate, labelled "xor2". The other input of xor2 comes from the circuit input pin, IN3. The output of xor2 feeds the output pin of the circuit, called "OUT".

Notice that patterns to test a sequential circuit are more complicated than patterns to test a simple combinatorial circuit because the tests must observe defects which may occur either before or after the memory element. If the error occurs before the memory element, the memory element must be used to capture the incorrect value so that it can eventually be measured. An example set of patterns to test the circuit described in FIG. 4 is as follows.

| Pattern | Event | IN1 | IN2 | IN3 | CLK | OUT |
|---|---|---|---|---|---|---|
| 1 | A | 0 | 1 | 0 | 0 | |
|   | B | 0 | 1 | 0 | Pulse | 1 |
|   | C | 0 | 1 | 1 | 0 | 0 |
| 2 | A | 0 | 0 | 0 | 0 | |
|   | B | 0 | 0 | 0 | Pulse | 0 |
|   | C | 0 | 0 | 1 | 0 | 1 |
| 3 | A | 0 | 0 | 0 | 0 | |
|   | B | 0 | 0 | 0 | Pulse | 0 |
|   | C | 0 | 1 | 1 | 0 | 1 |
| 4 | A | 0 | 1 | 0 | 0 | |
|   | B | 0 | 1 | 0 | Pulse | 1 |
|   | C | 0 | 0 | 1 | 0 | 0 |
| 5 | A | 1 | 0 | 1 | 0 | |
|   | B | 1 | 0 | 1 | Pulse | 0 |
|   | C | 1 | 0 | 1 | 0 | 0 |
| 6 | A | 1 | 1 | 1 | 0 | |
|   | B | 1 | 1 | 1 | Pulse | 1 |
|   | C | 1 | 1 | 1 | 0 | 1 |

Notice that in each test pattern, the output is measured twice. The output is not measured in event A in each pattern because the flip-flop is assumed to be uninitialized in event A, and the clock has not been pulsed, so the output of the circuit is undeterminate. In each pattern, when the clock is pulsed in event B, any errors in the circuit that precede the flip-flop will be captured in the flip-flop and propagated to the output. Event C changes the state of the circuit again. However, since the clock is not pulsed a second time, the changes in event C in the part of the circuit which precedes the latch (IN1, IN2 and xor1) will not affect the output. Errors which affect IN3 or xor2 can then be detected.

Since each pattern in this example goes through two measurable circuit states, the invariant analysis tool can be used either after event B, or after event C, or after both. Two sets of miscompares can be used to illustrate the effects of multiple circuit states on the invariant analysis tool. The first set of miscompares results from a dominant net short where net IN1 dominates net IN2. In this case, failures would be measured at events 1.B, 1.C, 4.B, 4.C, 5.B, and 5.C. Performing invariant analysis on the equation IN2 !=* at the end of event B in each pattern results in the following table.

| Score | TP | FP | TF | FF | Equation |
|---|---|---|---|---|---|
| 10 | 0 | 3 | 0 | 3 | Pin OUT != Pin IN2; |
| 37 | 1 | 2 | 1 | 2 | Net xor1 != Pin IN2; |
| 37 | 1 | 2 | 1 | 2 | Net flipflop != Pin IN2 |
| 70 | 0 | 3 | 2 | 1 | Pin CLK != Pin IN2; |
| 100 | 0 | 3 | 3 | 0 | Pin IN1 != Pin IN2; |
| 100 | 0 | 3 | 3 | 0 | Pin IN3 != Pin IN2; |

In this case, since IN1 and IN3 always have the same values for every pattern in both event A and event B, it is impossible to determine if IN1 dominates IN2, or if IN3 dominates IN2. However, there is strong evidence from invariant analysis that one of IN1 or IN3 dominates IN2. This evidence is not as clear when invariant analysis is examined only during the state in event C. In this case, the results are as follows.

| Score | TP | FP | TF | FF | Equation |
|---|---|---|---|---|---|
| 34 | 2 | 1 | 1 | 2 | Pin CLK != Pin IN2; |
| 37 | 1 | 2 | 1 | 2 | Pin OUT != Pin IN2; |
| 37 | 1 | 2 | 1 | 2 | Net xor1 != Pin IN2; |
| 37 | 1 | 2 | 1 | 2 | Net flipflop != Pin IN2; |
| 67 | 1 | 2 | 2 | 1 | Pin IN1 != Pin IN2; |
| 67 | 1 | 2 | 2 | 1 | Pin IN3 != Pin IN2; |

Notice that these results indicate that there is evidence that NO net dominates net IN2. These results can be explained by the fact that the cause of the failure precedes the memory element. Therefore, looking at the circuit before the clock is pulsed allows invariant analysis to observe the effects of the error. However, after the pulse, the effects of the error are not as observable. Therefore, the scores calculated by invariant analysis are not representative of what is truly occuring in the circuit.

An example of an error in the circuit after the memory element demonstrates that it is worthwhile to perform invariant analysis at event C. If net IN2 dominates net IN3, miscompares will occur in events 1.B, 2.C, 4.B, 4.C, 5.B, and 5.C. In this case, the results of invariant analysis on the equation "* !=Pin IN3", measured at event B, is as follows.

| Score | TP | FP | TF | FF | Equation |
|---|---|---|---|---|---|
| 10 | 0 | 3 | 0 | 3 | Pin IN1 != Pin IN3; |
| 37 | 1 | 2 | 1 | 2 | Pin CLK != Pin IN3; |
| 37 | 1 | 2 | 1 | 2 | Net xor1 != Pin IN3; |
| 67 | 1 | 2 | 2 | 1 | Net flipflop != Pin IN3; |
| 100 | 0 | 3 | 3 | 0 | Pin OUT != Pin IN3; |
| 100 | 0 | 3 | 3 | 0 | Pin IN2 != Pin IN3; |

In this case, there is strong evidence that net IN3 is dominated by net IN2 or by net OUT. This is because the effects of the error can be observed as soon as the clock is pulsed. However, this evidence persists for the circuit state in event C for errors after the memory element, as indicated in the following invariant analysis results measured after event C.

| Score | TP | FP | TF | FF | Equation |
|---|---|---|---|---|---|
| 7 | 1 | 2 | 0 | 3 | Pin IN1 != Pin IN2; |
| 34 | 2 | 1 | 1 | 2 | Net flipflop != Pin IN2 |
| 67 | 1 | 2 | 2 | 1 | Pin OUT != Pin IN2; |
| 67 | 1 | 2 | 2 | 1 | Net xor1 != Pin IN2; |
| 90 | 3 | 0 | 3 | 0 | Pin CLK != Pin IN2; |
| 100 | 0 | 3 | 3 | 0 | Pin IN3 != Pin IN2; |

In general, the introduction of memory elements introduces many measurable states, and can be much more complicated. However, it is clear that the user must be able to identify the specific states of interest within all patterns being simulated. This can be accomplished by specifying the performance of invariant analysis based on the number of clock pulses. Specifically, the user can specify the number of clock pulses that may occur in a single pattern before invariant analysis accumulates statistics, and the number of clock pulses after which invariant analysis should stop collecting statistics.

Boolean Equation Syntax

The description of the boolean equations accepted is detailed in the syntax diagram shown in FIG. 3. Note specifically the use of an asterisk (*) as a shorthand nomenclature for describing many equations. In this case, an asterisk represents every net in the circuit. To keep the number of equations tractable, only a single asterisk is allowed in a single boolean equation specification. This shorthand provides the capability to pose the following kinds of questions.

Which nets are always at 0 when the circuit fails, and at 1 when it passes? (*=0;)

Which nets are always at 1 when the circuit fails, and at 0 when it passes? (*=1;)

What net is always opposite to the value of net A when the circuit fails, and equal to net A when it passes? (*!=net A;)

The specification of the boolean equations is purposely left open-ended to facilitate the use of this tool in ways which have not yet been determined. The tool is flexible enough to answer questions which have not yet been posed.

The software reads the specification of the boolean equations from a user specified file. The user also specifies the logic model, test patterns, and failure data associated with the process.

Special Handling for Boolean Equations with Asterisks

When the boolean equation parser detects an asterisk, space is reserved to collect statistics for n "equations", where "n" is the number of nodes in the logic. The parser keeps track of where the asterisk occurred in the equation, as well as where the first reserved space for the statistics is.

When the monitor is called by the simulator to evaluate the equations, the monitor works on each equation in turn. When the monitor encounters an equation which contains an asterisk, the monitor first substitutes the current circuit value for all non asterisk references to pins or nets. Then, the monitor evaluates the truth value of the equation when a "1" is substituted for the asterisk, and saves this information (call it TV1.) The monitor then re-evaluates the truth value of the equation by substituting a zero for the asterisk, and saves this result in TV0. Similarly, the monitor calculates the truth value of the equation with the asterisk at X (TVX), and high impedance (TVZ). Then, the monitor loops through each node in the logic model of the part. When the monitor is working on node i, it first determines the current value of node i. If the value is 1, the monitor uses TV1. If the value is zero, the monitor uses TV0, and so on. The monitor uses the combination of the truth value and knowledge about whether this pattern passed or failed to select a category to get incremented from the four categories TP, FP, TF, and FF. It then updates the statistics offset by i to increment the proper statistics.

Calculating scores and reporting on equations with asterisks works exactly as those equations without asterisks, except for the fact that the report indicates which specific node has been used to determine each set of statistics.

This technique allows the monitor to evaluate each boolean equation with asterisks only four times (for values of 0, 1, X, and Z) rather than n times where n is the number of nodes. For a typical ASIC with one-million gates, this represents a 250,000 to one speed improvement.

Given a Candidate Dominated Net (Available from Analysis of Traditional Stuck Fault Diagnostics), Identify the Dominated Net Traditional stuck-fault diagnostics can identify a dominated net. In this case, the combination of a stuck-at-one fault and a stuck-at-zero fault on the same net indicates a potentially dominated net. However, for cases where the dominant net is at the same value as the dominated net, a stuck fault on the dominated net will predict a failure which is not measured. Therefore, if the combination of a stuck-at-one and a stuck-at-zero fault predicts every failure that was measured, but also predicts extra failures, that net is a good candidate for a dominated net.

In this case, assuming net A is the dominated net, it is possible to construct the equation "net A !=*; ". This equation can be evaluated by the invariant analysis tool to determine which net or nets are at opposite values from the potential dominated net every time the circuit fails, and never when the circuit does not fail. A high score from this equation indicates a highly likely candidate for the dominating net. It is easy to take this information to the physical design of the logic to determine the location in the physical design where the dominated net is nearby the candidate dominating net. This localized area can then be examined to determine if the two nets are in fact shorted together.

Given One Net of a Shorted Net Pair that Behaves Like an AND or OR Function, Identify the Other Net that Participates in the Short Assume nets A and B are shorted together, and behave like an AND. In other words, if a zero appears on either net A or net B, then a zero is propagated through both nets A and B, no matter what the value of the other net was supposed to be. In this case, a combination of net A stuck at zero and net B stuck at zero will explain all the failures, but will predict extra failures when both A and B are at a one. If the likelihood that net A is at zero is not random, (e.g. if A is at zero for 90% of the patterns), then the net B stuck at zero fault will be identified as the highest scoring stuck fault using traditional diagnostics. In this case, the equation "(net B !=0) && (*=0);" will identify which nets are most likely to be at zero when net B is not at zero. The resulting nets are the most probable candidates for the shorted net. It is possible to take each high scoring candidate, and use the equation "((net B !=0) && (net candidate=0))||((net B=0) && (net candidate !=0));" to reduce the candidate list even further. The candidates with a high score can then be examined in the physical design to determine which candidate pair of nets are physically adjacent.

Improve Traditional Stuck Fault Diagnostics Run Times

Traditional diagnostics depends on simulating many candidate faults for many patterns, which is very expensive. Invariant analysis can reduce this expense by reducing the number of stuck faults that must be considered during traditional diagnostics. For instance, net A stuck at one can only be detected when net A is supposed to be at zero. Therefore, it is possible to identify all candidate stuck fault failures by running invariant analysis with the equations "*=1;" and "*=0;". Any net which scores greater than 90 is a likely candidate for a stuck fault. Traditional diagnostics need consider only those faults which are on nets which have a score greater than 90.

Identify Portions of the Logic Which Participate in a Non-Stuck Fault Failure Mechanism Often, it is possible to identify special conditions using invariant analysis with the equations "*=0;" and "*=1; ". For instance, if the failure is related to special clock logic which is enabled by a single net, and the failures only occur when the special clock logic is enabled, invariant analysis can identify that condition. The result is that the special clock logic can immediately become the target for further analysis, and other parts of the logic can be ignored.

The present invention has been described by way of a single preferred embodiment. It is needless to say that various changes, modifications can be made particularly to the Invariant Analysis, both in terms of content and added functions without departing from the scope of the subject matter of the invention.

What is claimed is:

1. A method for diagnosing failures within logic being tested, the logic being represented by a plurality of nodes interconnected by way of nets, the relationship between the logic and the failures being provided by boolean equations (BEs), the method comprising the steps of:

a) parsing the BEs;

b) defining a plurality of categories indicative of matches between the BEs to failures within the logic;

c) performing a simulation of the logic by way of test patterns, periodically invoking a monitor to determine the occurrence of a match between the BEs and the failures occurring in the logic;

d) incrementing at periodic intervals a count in the category which describes the relationship between the equations, the failures, and simulated logic values, and accumulating the respective counts in each of the categories for each successive BE; and e) calculating for each of the categories a final score based on the respective incremental counts, wherein the final score is indicative of a correlation existing between conditions specified by the BEs and the failures within the logic.

2. The method of claim 1, wherein each of the categories comprises two fields, the first of the two fields being indicative of a true-false (TF) condition assigned to the BE being evaluated, the true condition indicating a match, and a false condition indicating a mismatch, and the second field representing a pass-fail (PF) condition of the logic, the pass condition indicating the absence of a failure in the logic under test and the fail condition representing a failure of the logic being tested.

3. The method of claim 2, wherein the plurality of categories are True for Passing Patterns (TP), False for Passing Patterns (FP), True for Failing Patterns (TF) and False for Failing Patterns (FF).

4. The method of claim 1, wherein the step of simulating the logic further comprises the steps of:
    creating a table to record an entry for each node within the logic; and
    updating the table with the binary value taken by the node at a predetermined time.

5. The method of claim 1, wherein each of the BEs is evaluated sequentially by the monitor invoked by the simulator.

6. The method of claim 1, further comprising identifying dominant nets by using the final score.

7. The method of claim 6, wherein each of the BEs is evaluated by determining which of the dominant nets are at opposite binary values each time a failure is detected.

8. The method of claim 6, wherein candidates for nets being shorted are extracted by examining the physical location of the nets located in a proximity of the dominant net.

9. The method of claim 6, wherein the candidates shorted are further identified by combining stuck-fault diagnostics with an analysis of the binary values at each of the nets.

10. The method of claim 1, wherein a non-stuck failure within a selected portion of the logic causes an incorrect measure during test causing a mismatch between the expected data and measure data are identified by identifying a necessary condition for the failure to occur.

11. The method of claim 1, further comprising the step of identifying a shorted net within a shorted net pair by finding which of the nets forming the shorted net pair behaves like an OR or AND gate.

12. The method of claim 11, wherein the second net forming the shorted net pair is identified by calculating a BE for the net that behaves like an AND or OR gate and comparing the BE to the BEs representing all the other nets within the logic, wherein the net having the highest score closest to 100 represents the other net of the shorted net pair.

13. A program storage device readable by a machine, tangibly embodying a program of instructions executable by the machine to perform method steps for diagnosing failures within logic being tested, the logic being represented by a plurality of nodes interconnected by way of nets, the relationship between the logic and the failures being provided by boolean equations (BEs), said method steps comprising:
    a) parsing the BEs;
    b) defining a plurality of categories indicative of matches between the BEs to failures within the logic;
    c) performing a simulation of the logic by way of test patterns, periodically invoking a monitor to determine the occurrence of a match between the BEs and the failures occurring in the logic;
    d) incrementing at periodic intervals a count in the category which describes the relationship between the equations, the failures, and simulated logic values, and accumulating the respective counts in each of the categories for each successive BE; and
    e) calculating for each of the categories a final score based on the respective incremental counts, wherein the final score is indicative of a correlation existing between conditions specified by the BEs and the failures within the logic.

* * * * *